US00RE47619E

(19) United States
(12) Reissued Patent
Kauhaniemi et al.

(10) Patent Number: US RE47,619 E
(45) Date of Reissued Patent: Sep. 24, 2019

(54) APPARATUS AND METHOD OF PROVIDING AN APPARATUS COMPRISING A BENDABLE PORTION

(71) Applicant: Nokia Technologies Oy, Espoo (FI)

(72) Inventors: Ilpo Kauhaniemi, Vantaa (FI); Mikael Kontkanen, Ilmarinen (FI); Esa-Sakari Maatta, Helsinki (FI); Kalevi Salo, Salo (FI); Vesa Nevalainen, Turku (FI)

(73) Assignee: Nokia Technologies Oy, Espoo (FI)

(21) Appl. No.: 15/456,663

(22) Filed: Mar. 13, 2017

Related U.S. Patent Documents

Reissue of:
(64) Patent No.: 9,506,279
Issued: Nov. 29, 2016
Appl. No.: 14/539,063
Filed: Nov. 12, 2014

(30) Foreign Application Priority Data

Nov. 13, 2013 (GB) ..... 1320011.8

(51) Int. Cl.
*G06F 1/16* (2006.01)
*E05D 1/04* (2006.01)
(Continued)

(52) U.S. Cl.
CPC ..... *G06F 1/1652* (2013.01); *E05D 1/04* (2013.01); *G06F 1/1681* (2013.01);
(Continued)

(58) Field of Classification Search
CPC .... G06F 1/1681; G06F 1/1652; G06F 1/1698; H04M 1/0216; H04M 1/0268;
(Continued)

(56) References Cited

U.S. PATENT DOCUMENTS 6,223,393 B1 5/2001 Knopf
7,532,916 B2 * 5/2009 Lee ..... 379/433.13
(Continued)

FOREIGN PATENT DOCUMENTS

CN 101840247 A 9/2010
CN 101853608 A 10/2010
(Continued)

OTHER PUBLICATIONS

Extended European Search Report received for corresponding European Patent Application No. 14191979.5, dated Feb. 25, 2015, 8 pages.

(Continued)

*Primary Examiner* — William C Doerrler
(74) *Attorney, Agent, or Firm* — Harrington & Smith

(57) ABSTRACT

According to various, but not necessarily all examples of the disclosure, there may be provided an apparatus and method wherein the apparatus comprises: a substrate configured to support a bendable display wherein the substrate comprises at least one bendable portion configured to enable the substrate to be moved between an open configuration and a closed configuration; and wherein the at least one bendable portion comprises a plurality of rod members and the rod members comprise interlocking portions wherein the interlocking portions comprise a projection configured to fit into a corresponding recess on an adjacent rod member so as to restrict relative movement of the rod members when the substrate is in the closed configuration.

36 Claims, 11 Drawing Sheets

(51) Int. Cl.
*H05K 5/02* (2006.01)
*H04M 1/02* (2006.01)

(52) U.S. Cl.
CPC ..... *G06F 1/1698* (2013.01); *H04M 1/0216* (2013.01); *H05K 5/0226* (2013.01); *H04M 1/0268* (2013.01); *Y10T 16/525* (2015.01); *Y10T 16/5257* (2015.01)

(58) Field of Classification Search
CPC ..... H05K 5/0226; E05D 1/04; Y10T 16/5257; Y10T 16/525
USPC ..... 361/679.02, 679.21, 679.27, 679.28; 16/224, 225, 226, 227; 455/575.3, 575.1
See application file for complete search history.

(56) References Cited

U.S. PATENT DOCUMENTS

| | | | | |
|---|---|---|---|---|
| 7,583,500 | B2 | 9/2009 | Ligtenberg et al. | 361/683 |
| 8,005,521 | B2 * | 8/2011 | Cho | 379/433.13 |
| 8,125,759 | B2 * | 2/2012 | Fukuma | F16G 13/18 248/349.1 |
| 2004/0266502 | A1 * | 12/2004 | Holtorf | 455/899 |
| 2007/0117600 | A1 | 5/2007 | Robertson, Jr. et al. | |
| 2007/0133156 | A1 * | 6/2007 | Ligtenberg | G06F 1/1616 361/679.27 |
| 2008/0018631 | A1 | 1/2008 | Hioki et al. | |
| 2008/0158795 | A1 | 7/2008 | Aoki et al. | |
| 2010/0232100 | A1 | 9/2010 | Fukuma et al. | |
| 2012/0044620 | A1 | 2/2012 | Song et al. | |
| 2012/0264489 | A1 | 10/2012 | Choi et al. | |
| 2012/0307423 | A1 * | 12/2012 | Bohn | 361/679.01 |
| 2012/0307472 | A1 | 12/2012 | Bohnet | |
| 2013/0070431 | A1 | 3/2013 | Fukuma et al. | |
| 2013/0120912 | A1 | 5/2013 | Ladouceur et al. | |
| 2013/0216740 | A1 | 8/2013 | Russell-Clarke et al. | |
| 2013/0216746 | A1 | 8/2013 | Piranda | |
| 2013/0219663 | A1 * | 8/2013 | Cai | 16/371 |
| 2014/0126133 | A1 * | 5/2014 | Griffin | G06F 1/1616 361/679.27 |
| 2014/0196253 | A1 * | 7/2014 | Song | 15/225 |
| 2015/0055287 | A1 * | 2/2015 | Seo | G06F 1/1652 361/679.27 |
| 2015/0077917 | A1 * | 3/2015 | Song | 361/679.27 |

FOREIGN PATENT DOCUMENTS

| | | | |
|---|---|---|---|
| CN | 103106845 | A | 5/2013 |
| CN | 103167070 | A | 6/2013 |
| CN | 103228114 | A | 7/2013 |
| EP | 2546720 | A2 | 1/2013 |
| EP | 2573644 | A2 | 3/2013 |
| JP | 3361820 | B2 | 1/2003 |
| JP | 2008228249 | A | 9/2008 |
| KR | 2008/0035709 | A | 4/2008 |
| KR | 2013/0073331 | A | 7/2013 |
| TW | 2010/09539 | A | 3/2010 |
| WO | WO-2012/167204 | A2 | 12/2012 |

OTHER PUBLICATIONS

PCT Application No. PCT/FI2014/050611, "An Apparatus and Method of Providing an Apparatus Comprising a Bendable Portion", filed on Aug. 7, 2014, 24 pages.

"Black Finished Flexible Metal Tube", Leflexo Industrial, Retrieved on Feb. 4, 2015, Webpage available at : http://www.leflexo.com/product_index.php?pid=18755&$products=Black%20Finished%20Flexible%20Metal%20Tube.

"Conceptual Flexi PDA Boasts Rubber Hinges, Flexible Display", Engadget, Retrieved on Feb. 5, 2015, Webpage available at : http://www.engadget.com/2007/05/16/conceptual-flexi-pda-boasts-rubber-hinges-flexible-display.

"Will It Bend Apple Patent Application Shows Off Seamless, Flexible Hinge", Arstechnica, Retrieved on Feb. 5, 2015, Webpage available at : http://arstechnica.com/apple/2013/08/will-it-bend-newly-granted-apple-patent-shows-off-seamless-flexible-hinge/.

Search Report received for corresponding United Kingdom Patent Application No. 1320011.8, dated May 12, 2014, 3 pages.

* cited by examiner

APPARATUS AND METHOD OF PROVIDING AN APPARATUS COMPRISING A BENDABLE PORTION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNOLOGICAL FIELD

Examples of the present disclosure relate to an apparatus and method of providing an apparatus comprising a bendable portion. In particular, they relate to an apparatus and method of providing an apparatus comprising a bendable portion in which a display may be provided across the bendable portion.

BACKGROUND

Apparatus comprising bendable portions are known. Such apparatus may be electronic devices. In such apparatus it is beneficial to protect sensitive components such as displays or other electronic components from damage which may be caused by the bending of the apparatus.

BRIEF SUMMARY

According to various, but not necessarily all examples of the disclosure, there may be provided an apparatus comprising: a substrate configured to support a bendable display wherein the substrate comprises at least one bendable portion configured to enable the substrate to be moved between an open configuration and a closed configuration; and wherein the at least one bendable portion comprises a plurality of rod members and the rod members comprise interlocking portions wherein the interlocking portions comprise a projection configured to fit into a corresponding recess on an adjacent rod member so as to restrict relative movement of the rod members when the substrate is in the closed configuration.

In some examples the interlocking portions may be configured to prevent the radius of curvature of the bendable portion exceeding a threshold.

In some examples the rod members may extend horizontally across the apparatus.

In some examples the rod members are coupled together by an overlying flexible layer. The overlying flexible layer may comprise metal.

In some examples the apparatus may further comprise a support structure configured to restrict movement of the substrate. The support structure may comprise at least one frictional component wherein the frictional component is configured to oppose movement of the substrate. The support structure may be coupled to the substrate. The support structure may be configured to pass through holes in the rod members.

In some examples an additional support substrate may be configured to provide further support for at least a portion of the display. In some examples the additional support substrate may be provided at the side of the apparatus. In some examples the additional support substrate may be coupled to the rod members. In some examples the additional support substrate may comprise a plurality of projections for interlocking with a plurality of recesses on a plurality of rod members.

In some examples the apparatus may further comprising a display. The display may be continuous across the bendable portion.

In some examples the apparatus is in the closed configuration a first portion of the display and a second portion of the display are configured facing each other.

In some examples the apparatus may further comprise a magnet for holding the apparatus in an open configuration.

In some examples there may also be provided an electronics communication device comprising an apparatus as described above.

According to various, but not necessarily all examples of the disclosure, there may be provided a method comprising: providing a substrate configured to support a bendable display wherein the substrate comprises at least one bendable portion configured to enable the substrate to be moved between an open configuration and a closed configuration; and providing a plurality of rod members within the at least one bendable portion wherein the rod members comprise interlocking portions wherein the interlocking portions comprise a projection configured to fit into a corresponding recess on an adjacent rod member so as to restrict relative movement of the rod members when the substrate is in the closed configuration.

In some examples the interlocking portions may be configured to prevent the radius of curvature of the bendable portion exceeding a threshold.

In some examples the rod members may be provided extending horizontally across the apparatus.

In some examples the method may further comprise coupling the rod members together with an overlying flexible layer. In some examples the overlying flexible layer may comprise metal.

In some examples the method may further comprise providing a support structure configured to restrict movement of the substrate. In some examples the support structure may comprise at least one frictional component wherein the frictional component may be configured to oppose movement of the substrate.

In some examples the method may further comprise coupling the support structure to the substrate. In some examples the support structure may be configured to pass through holes in the rod members.

In some examples the method may further comprise providing an additional support substrate configured to provide further support for at least a portion of the display.

In some examples the additional support substrate may be provided at the side of the apparatus.

In some examples the method may further comprise coupling the additional support substrate to the rod members.

In some examples the additional support substrate may comprise a plurality of projections for interlocking with a plurality of recesses on a plurality of rod members.

In some examples the method may further comprise providing a display. The display may be continuous across the bendable portion.

In some examples the apparatus may be configured so that in the closed configuration a first portion of the display and a second portion of the display are configured facing each other.

In some examples the method may further comprise providing a magnet for holding the apparatus in an open configuration.

The apparatus may be an apparatus such as a communications apparatus or a gaming apparatus which may enable wireless communication.

BRIEF DESCRIPTION

For a better understanding of various examples that are useful for understanding the detailed description, reference will now be made by way of example only to the accompanying drawings in which.

DETAILED DESCRIPTION

Figure 1A:
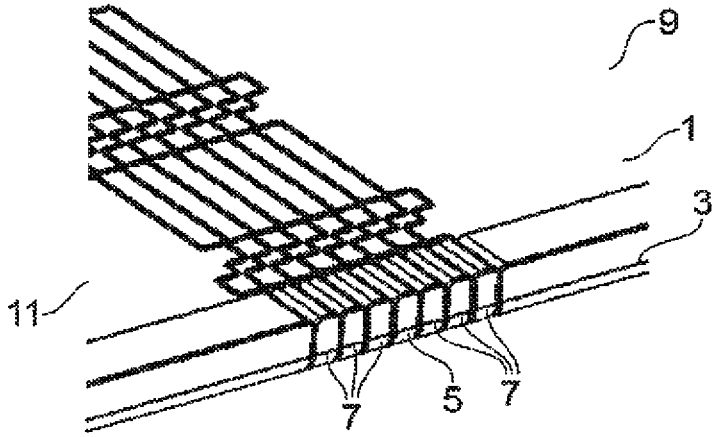
FIGS. 1A to 1C illustrate an apparatus.

The Figures illustrate an apparatus 1 comprising: a substrate 3 configured to support a bendable display wherein the substrate 3 comprises at least one bendable portion 5 configured to enable the substrate 3 to be moved between an open configuration and a closed configuration; and wherein the at least one bendable portion 5 comprises a plurality of rod members 7 and the rod members 7 comprise interlocking portions 31 wherein the interlocking portions 31 comprise a projection 33 configured to fit into a corresponding recess 35 on an adjacent rod member 7 so as to restrict relative movement of the rod members 7 when the substrate 3 is in the closed configuration.

Figure 1B:
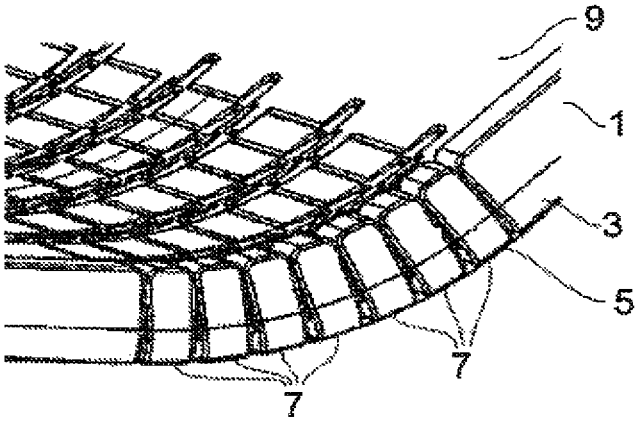
Figure 1C:
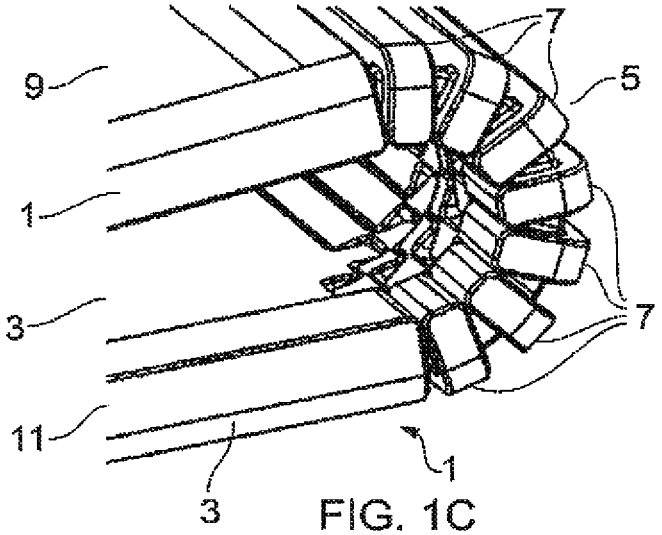

FIGS. 1A to 1C illustrate an apparatus 1 according to an example of the disclosure. The apparatus 1 comprises a substrate 3. The substrate 3 comprises at least one bendable portion 5.

The apparatus 1 may be provided within a device such as an electronics communication device. The apparatus 1 and/or the electronics communication device may be configured for wireless communication. For example the electronics communication device may be a mobile cellular telephone or a tablet computer or any other device which may be connected to a wireless network to enable the apparatus 1 to send and receive data. The electronic device may be configured to control a display to display information.

The apparatus 1 may be a handheld apparatus 1 which a user may be able to carry in their hand.

The substrate 3 may comprise a flat or substantially flat surface on which the components such as a display may be mounted. In some examples a flexible sheet may be fixed to the surface of the substrate 3. The flexible sheet may comprise, for example metal. The flexible metal sheet may be adhered to the surface of the substrate 3. A display or other electronic component may then be fixed to the flexible metal sheet. It is to be appreciated that other means of attaching a display or electronic component to the substrate 3 may also be used.

In the examples of FIGS. 1A to 1C the substrate 3 comprises a first region 9, a second region 11 and at least one bendable portion 5. The bendable portion 5 is provided between the two regions 9, 11. As illustrated in FIGS. 1A to 1C the first region 9 is provided on the right hand side of the bendable portion 5 and the second region 11 is provided on the left hand side of the bendable portion 5. Each of the regions 9, 11 may be the same size or approximately the same size. In other examples the regions 9, 11 may be different sizes and/or shapes.

In some examples the regions 9, 11 of the substrate 3 on either side of the bendable portion 5 may be rigid or substantially rigid. The regions 9, 11 of the substrate 3 may be rigid so as to prevent a display or other electronic component which is mounted on the substrate from being deformed by a user in any region other than the bendable portion 5.

In the example of FIGS. 1A to 1C one bendable portion 5 is provided. The bendable portion is provided at the midpoint of the substrate 3. It is to be appreciated that in other examples more than one bendable portion 5 may be provided. It is also to be appreciated that in other examples the bendable portion 5 may be provided in other positions of the substrate 3.

The bendable portion 5 may comprise a plurality of rod members 7. The plurality of rod members 7 may extend horizontally across the apparatus 1. The plurality of rod members 7 may be configured to move relative to each other to enable the substrate 3 to be moved between an open and closed configuration. The plurality of rod members 7 may comprise interlocking portions which may be configured to restrict relative movement of the rod members 7 when the substrate 3 is in a closed configuration. Examples of the plurality of rod members 7 are illustrated in FIGS. 3A to 3C and 4 and described below.

In the example of FIGS. 1A to 1C the substrate 3 is configured to be moved between an open configuration and a closed configuration. In FIG. 1A the substrate 3 is configured in an open configuration. In the open configuration the two regions 9, 11 of the substrate 3 are arranged adjacent to each other so that the surface of the substrate 3 provides a continuous flat or substantially flat surface. Electronic components such as a display may be mounted on the substantially flat surface.

In FIG. 1B the substrate 3 is configured in a partially open configuration. The angle between the first region 9 and the second region 11 may be an obtuse angle. In the example of FIG. 1B the angle may be around 135°. In examples where a display is mounted on the substrate 3 the two regions 9, 11 may be arranged in a partially open configuration so that the two regions 9, 11 may be viewed simultaneously by a user.

In FIG. 1C the substrate 3 is configured in a closed configuration. In the closed configuration the two regions 9, 11 of the substrate 3 overlay each other. In examples where a display is mounted on the substrate 3 the two regions 9, 11 may be arranged overlaying each other so that a first portion of the display and a second portion of the display are facing each other.

Apparatus 1 such as the example apparatus of FIGS. 1A to 1C provides an substrate 1 with a large surface area when it is the open configuration. This may increase the area available for electronic components such as displays. However the apparatus 1 can be folded when it is not in use which may make the apparatus 1 easier and more convenient for a user to carry. The apparatus 1 may also be arranged into a partially open configuration which may provide for a more comfortable configuration for use in some examples.

Figure 2A:
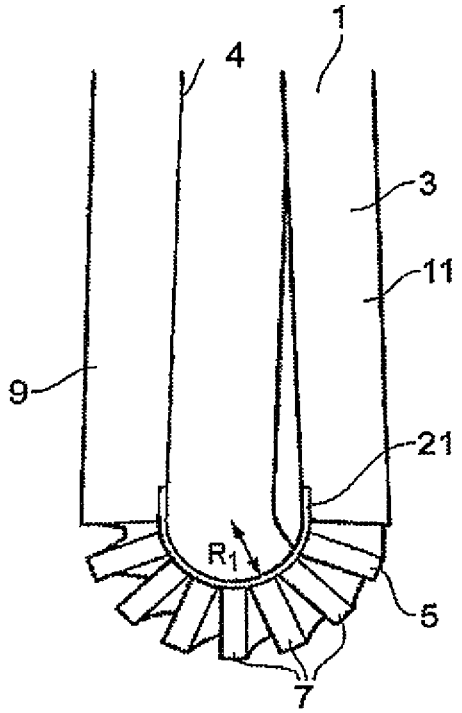
FIGS. 2A and 2B illustrate an apparatus in a closed configuration.
Figure 2B:
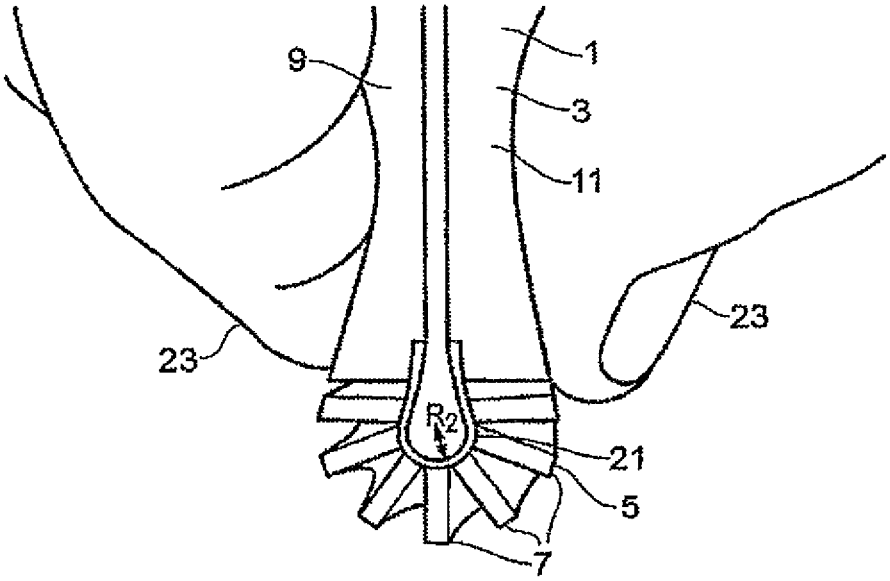

FIGS. 2A and 2B illustrate a side view of the bendable portion 5 of the substrate 3 when the apparatus 1 is arranged in the closed configuration. The bendable portion comprises a plurality of rod members 7. In the examples of FIGS. 2A and 2B a flexible sheet 21 may be mounted on the substrate 3. The flexible sheet 21 may extend over the bendable portion 5 of the substrate 3.

In some examples a display 4 may be mounted on the flexible sheet 21. In such examples the display 4 and the substrate 3 may be arranged so that the display 4 is continuous across the bendable portion 5. The display 4 may be configured so that information may be displayed in the portion of the display 4 which is overlaying the bendable portion 5 of the substrate 3. In examples where the display 4 comprises a touch sensitive display the display 4 may be configured so that a user can actuate the display 4 in the portion of the display which is overlaying the bendable portion 5 of the substrate 3.

In FIG. 2A the apparatus 1 is arranged in the closed configuration. In the bendable region the flexible sheet 21 has a first radius of curvature $R_1$. The radius of curvature $R_1$ may be such that the stresses and strains within the flexible sheet are below a threshold. The threshold stresses and strains may be such that the flexible sheet 21 can be moved between the open and closed configurations many times, for example tens of thousands of times, without damage to the flexible sheet 21. In examples where an electronic component such as a display is fixed to the flexible sheet 21 the threshold stresses and strains may be such that the display 4 can be moved between the open and closed configurations many times, for example tens of thousands of times, without damage to the display 4.

In FIG. 2B the apparatus 1 is arranged in a closed configuration but additional forces are applied to the apparatus 1. In the particular example of FIG. 2A the substrate 3 is being pressed by the user's fingers 23. This additional force provided by the user has caused further bending of the bendable portion 5.

In the closed and compressed configuration of FIG. 2B the flexible sheet 21 has a second radius of curvature $R_2$. The second radius of curvature $R_2$ may be smaller than the first radius of curvature $R_1$. The flexible sheet 21 may be more bent or more deformed in the closed and compressed configuration than in the closed configuration. If the flexible sheet 21, or a component mounted on the sheet such as a display, is bent or deformed too much the stresses and strains within the flexible sheet 21 or component may lead to failure of the flexible sheet 21 or component.

In FIG. 2B the apparatus 1 is being compressed by the user's fingers 23. It is to be appreciated that the apparatus 1 may be compressed unintentionally, for example if the apparatus 1 was accidentally sat on or stood on or if heavy objects were placed on top of the apparatus 1. It is useful to provide a means for preventing the apparatus 1 from being further compressed in the closed configuration as this may protect the display and other electronic components in the apparatus 1.

Figure 3A:
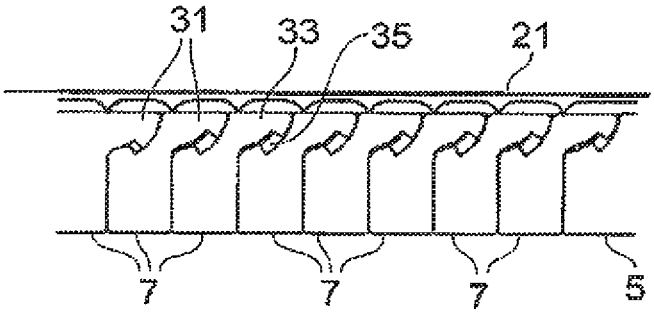
FIGS. 3A to 3C illustrate an apparatus.
Figure 3B:
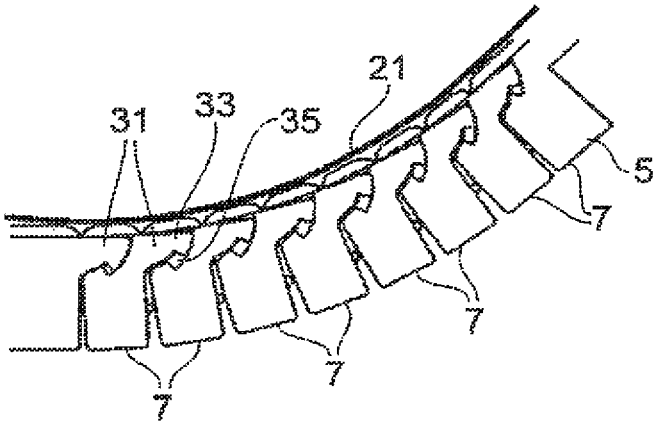
Figure 3C:
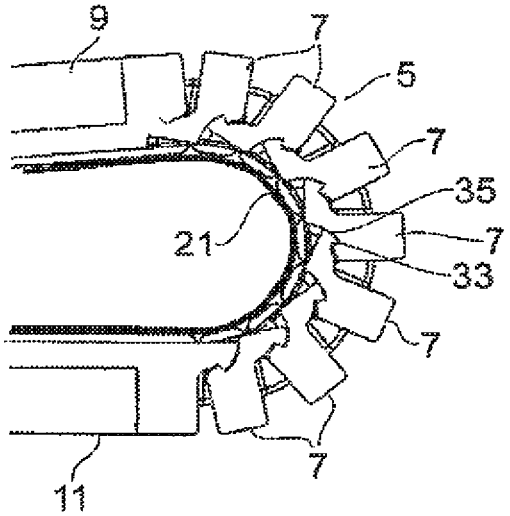

FIGS. 3A to 3C illustrate an apparatus 1 according to examples of the disclosure. FIGS. 3A to 3C illustrate a cross section through a bendable portion 5 of the substrate 3. The bendable portion 5 comprises a plurality of rod members 7.

In the example of FIGS. 3A to 3C a flexible sheet 21 is provided overlaying the substrate 3. In some examples components such as a flexible display may be mounted on the flexible sheet 21.

In the example of FIGS. 3A to 3C the bendable portion 5 is configured to enable the substrate 3 to be moved between an open configuration and a closed configuration. In FIG. 3B the substrate 3 is configured in a partially open configuration. In FIG. 3C the substrate 3 is configured in a closed configuration.

The rod members 7 comprise interlocking portions 31. The interlocking portions 31 may be configured to enable the bendable portion 5 to move between the open and closed configurations but restrict the relative movement of the rod members 7 once the substrate 3 is in the closed configuration.

In the example of FIGS. 3A to 3C the interlocking portion 31 comprises a projection 33 configured to fit into a corresponding recess 35 on an adjacent rod member 7. In the examples of FIGS. 3A to 3C the projections 33 and recesses 35 are curved so as to enable the rod members 7 to move relative to each other between the open and closed configurations. In the example of FIGS. 3A to 3C each rod member 7 has a projection 33 on one side and a recess 35 on the other. The projections 33 and recesses are provided in an upper portion of the rod members 7.

In the open configuration as illustrated in FIG. 3A. The flexible sheet 21 may be flat or substantially flat. The projections 33 are positioned at the top of the recesses 35. The lower portions of the rod members are substantially rectangular in cross section. In the open configuration the lower portions of the rod members 7 abut each other so that there is no gap between lower portions of adjacent rod members 7. Arranging the lower portions of the rod members 7 to abut each other may restrict movement of the bendable portion 5. For example this may prevent the bendable portion from being compressed and/or from being bent into a reflex angle.

In the partially open configuration as illustrated in FIG. 3B the rod members 7 have rotated relative to each other. The projections 33 have moved part way down the recesses 35. In the partially open configuration the lower portions of the rod members 7 are spaced from each other so that there is now a gap between lower portions of adjacent rod members 7. The flexible sheet 21 may control the path that the bendable portion 5 follows as it is moved between the open and closed configurations.

In the closed configuration as illustrated in FIG. 3C. The projections 33 have moved so that they are now positioned at the bottom of the recesses 35. In the closed configuration the lower edge of the recesses 35 prevents further movement of the projection 33 and so restricts further movement of the rod members 7 relative to each other. This prevents the radius of curvature of the bendable portion 5 of the substrate 3 from exceeding a threshold.

In the closed configuration the lower portions of the rod members 7 are spaced from each other so that there is a gap between lower portions of adjacent rod members 7.

Figure 4A:
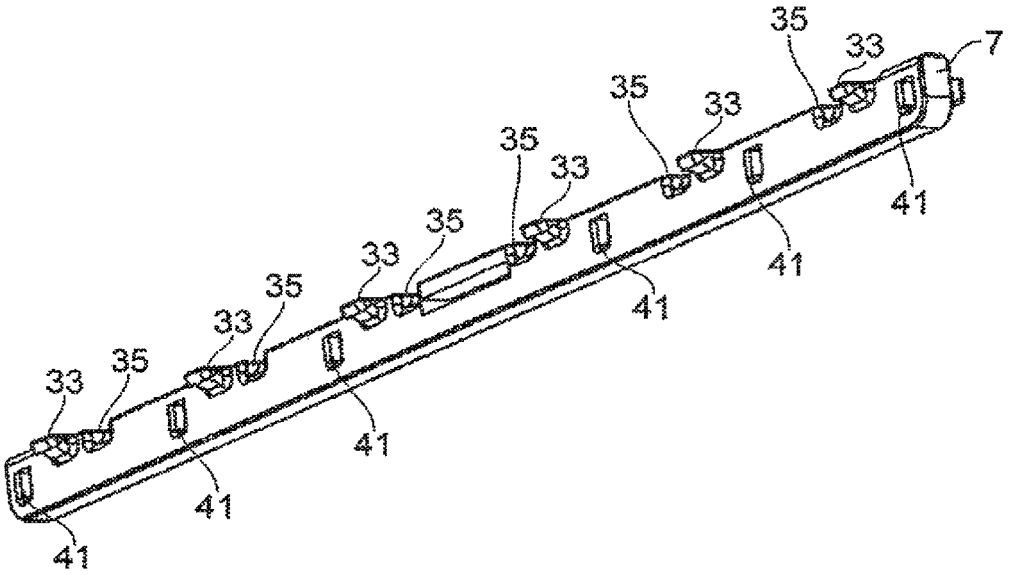
FIGS. 4A and 4B illustrate rod members.
Figure 4B:
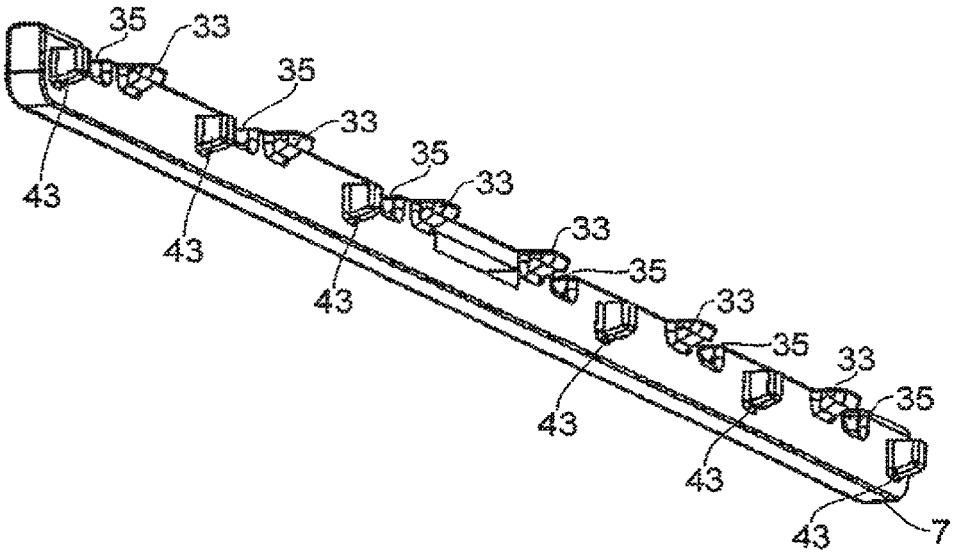

FIGS. 4A and 4B illustrate an example rod member 7 in more detail. FIG. 4A illustrates a left hand side of an example rod member 7 and FIG. 4B illustrates a right hand side of an example rod member 7.

The rod members 7 may comprise elongate members. The rod members 7 may have lengths which are several times greater than their widths.

In the example of FIGS. 4A and 4B a plurality of recesses and projections are provided along the length of the rod member 7. This provides a plurality of interlocking portions 31 along the length of the rod member 7 and so enables the rod members 7 to form a rigid structure when the bendable portion 5 is in the closed configuration.

In the particular examples of FIGS. 4A and 4B corresponding projections 33 and recesses 35 are provided on each side of the rod member. This may make the bendable portion 5 more rigid in the closed configuration.

In the examples of FIGS. 4A and 4B the rod member 7 also comprises a plurality of holes 41 on the left hand side and a plurality of corresponding protrusions 43 on the right hand side. The protrusions 43 may be configured to fit into the holes 41 of an adjacent rod member 7 when the rod members 7 are positioned adjacent to each other. The holes 41 and protrusions 43 may be configured to hold the rod members 7 adjacent to each other when the apparatus 1 is in an open configuration but to allow the rod members 7 to move relative to each other as the apparatus 1 is moved into the closed configuration.

The plurality of rod members 7 may be made of any suitable material. The rod members 7 may be made out of a rigid material such as plastic. The rod members may be formed by any suitable method such as molding.

FIGS. 5A to 5D illustrate a plurality of rod members 7 arranged to form a bendable portion.

Figure 5A:
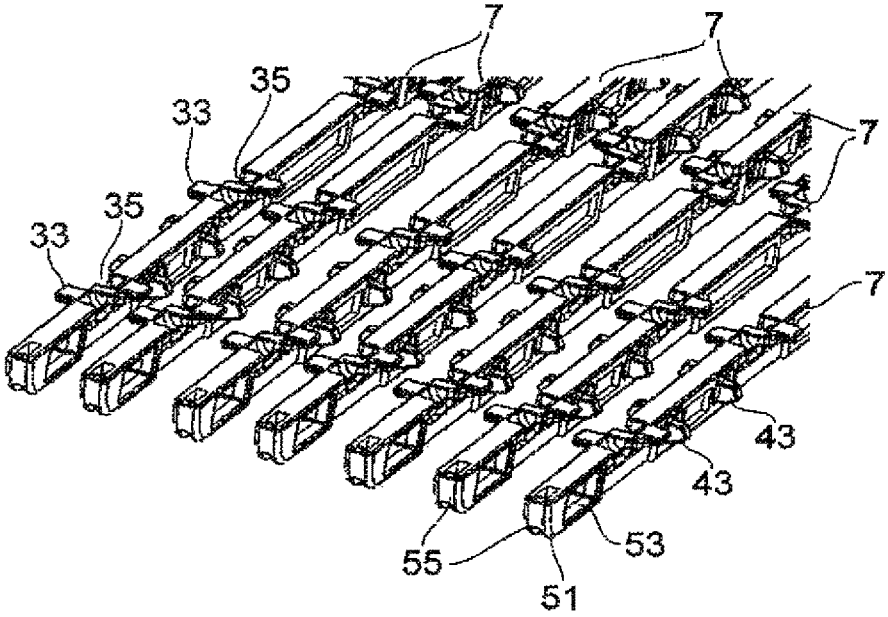
FIGS. 5A to 5D illustrate rod members.

FIG. 5A illustrates a plurality of rod members 7. In FIG. 5A the plurality of rod members 7 are positioned spaced from each other so that the respective projections 33 and recesses 35 can be seen. In FIG. 5A the protrusions 43 can be seen. The corresponding holes 41 are provided on the opposite side of the rod members 7 and so are not visible in the view of FIG. 5A.

In the example of FIG. 5A the rod members comprise an edge portion 51. The edge portion comprises a first hole 53 and a second hole 55. The first hole 53 may be configured to receive a support structure. The support structure may comprise components such as frictional components which may be configured to hold the apparatus 1 in partially open configurations. The second hole 55 may be configured to receive a support substrate. The support substrate may be configured to support components such as displays which are mounted on the substrate 3.

Figure 5B:
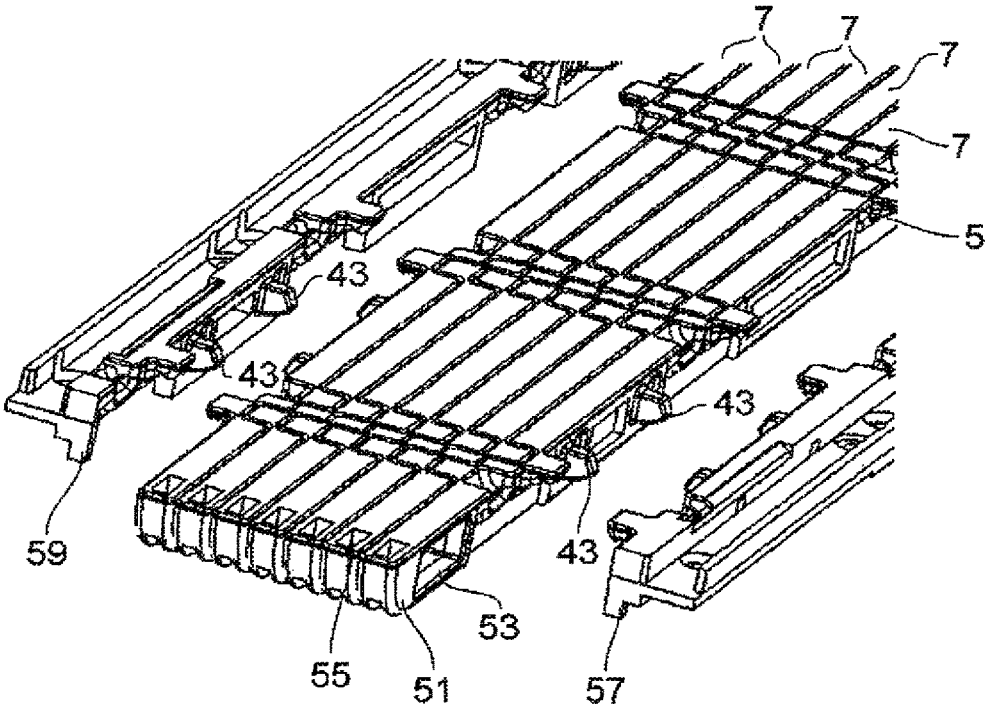

In FIG. 5B the plurality of rod members 7 are positioned adjacent to each other so that the respective projections 33 are fitted into the corresponding recesses 35. The protrusions 43 are also fitted into the corresponding holes 41. The rod members 7 are positioned adjacent to each other to provide a flat or substantially flat surface for the bendable portion 5 of the substrate 3.

In the example of FIG. 5B the apparatus 1 also comprises fixing portions 57, 59. The fixing portions 57, 59 may comprise any suitable means for coupling the portions 9, 11 of the substrate 3 to the rod members 7. In the example of FIG. 5B the first fixing portion 57 comprises a plurality of holes 41 configured to receive the protrusions 43 of the end rod member 7 and the second fixing portion 59 comprises a plurality of protrusions 43 configured to fit into a plurality of holes 41 of other end rod member 7. Both of the fixing portions 57, 59 comprise interlocking mechanisms 31 configured to interlock with the respective mechanisms 31 on the end rod members 7. This enables the fixing portions 57, 59 to be in held in position relative to the bending portion 5 and may prevent unwanted deformation of components mounted on the substrate 3.

When the plurality of rod members 7 are positioned adjacent to each other the first holes 53 may form a tunnel which may be configured to receive a support structure. Examples of a support structure are illustrated in FIGS. 6A to 6D and described below.

Figure 5C:
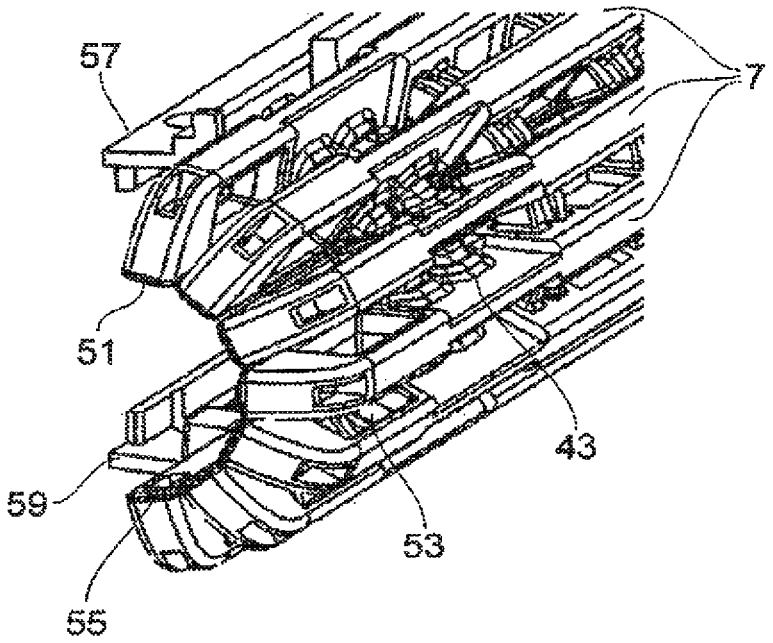
Figure 5D:
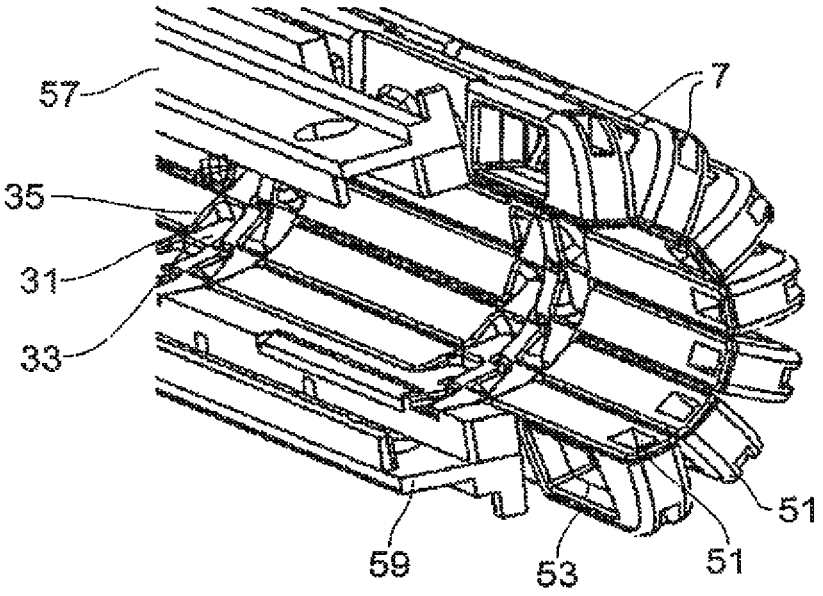

FIGS. 5C and 5D illustrate the bendable portion 5 in a closed configuration. FIG. 5C provides a rear view of the bendable portion 5 and FIG. 5D provides a front view.

In FIG. 5C it can be seen that the rod members 7 have rotated so that the lower portions of the rod members 7 now have a gap between them. The protrusions 43 may be moved out of or partially out of the holes 41. Parts of the protrusions 43 are visible in the configuration of FIG. 5C.

In FIG. 5D it can be seen that although the rod members 7 have rotated so that the lower portions of the rod members 7 now have a gap between them the upper portions of the rod members 7 are still adjacent to each other. This may reduce any stresses or strains induced in any flexible sheets 21 or components mounted over the bendable portion.

It can also be seen in FIG. 5D that the projections 33 have moved within the recess 35 so that the projection 33 abuts the lower edge of the recess 35. This restricts further bending of the bendable portion 5 and may prevent the radius of curvature of the bendable portion 5 exceeding a threshold.

FIGS. 6A to 6D illustrate an example support structure 61 according to examples of the disclosure. The support structure 61 may be configured to be coupled to the substrate 3. In some examples the support structure 61 may be configured to be received in the first holes 53 of the plurality of rod members 7.

The support structure 61 may be configured to restrict movement of the substrate 3. In the examples of FIGS. 6A to 6D the support structure 61 comprises a plurality of frictional components where the frictional components are configured to oppose movement of the substrate 3.

Figure 6A:
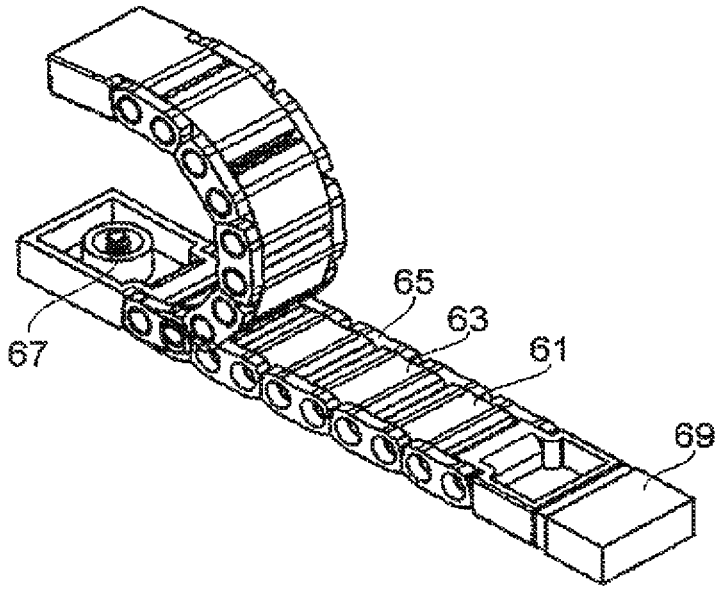
FIGS. 6A to 6D illustrate a support structure.

FIG. 6A illustrates the support structure 61 in an open configuration and in a closed configuration. The example support structure 61 comprises a plurality of inner linking portions 63 and a plurality of outer linking portions 65.

The respective linking portions 63, 65 may be made of any suitable material. For example, the inner linking portions 63 may be made of a plastic material such as polyoxymethylene or any other suitable material. The outer linking portions 65 may be made of a material such as metal 65.

The linking portions 63, 65 are configured to rotate relative each other to enable the support structure 61 to be moved between the open and closed configurations.

The support structure 61 may also comprise means for coupling the support structure 61 to the substrate 3. In the example of FIG. 6A the means comprises a screw 67. The screw 67 may be fixed into the substrate to hold the support structure 61 in position relative to the substrate 3. It is to be appreciated that other means of fixing the support structure 61 to a substrate 3 may be used in other examples of the disclosure.

In the example of FIG. 6A the support structure also comprises a locking mechanism 69. The locking mechanism 69 may be configured to hold regions 9, 11 of the substrate 3 in position relative to each other. The locking mechanism 69 may be configured to lock the apparatus 1 in the open configuration.

In some examples the locking mechanism 69 may comprise mechanisms configured to hold the apparatus 1 in a partially open configuration and/or in an open configuration. Such examples may comprise a magnet coupled to a moving end of a chain. A static magnet may be provided close to the chain and configured so that a shear force is provided when the moving magnet slides close to the static magnet. The shear force may provide a locking feeling.

In the example of FIG. 6A the locking mechanism 69 comprises a magnetic locking mechanism. An example of a locking mechanism 69 is illustrated in more detail in FIG. 10 and described below.

Figure 6B:
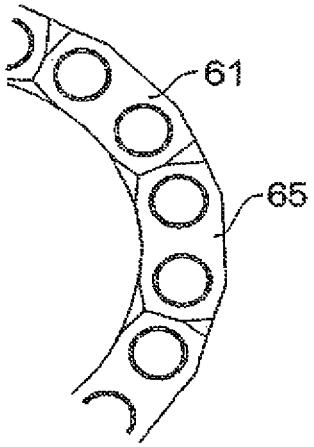

FIG. 6B illustrates a side view of the support structure 61 in a closed configuration. The outer linking portions 65 are shaped so that they are wider at the upper portion than at the lower portion. When the support structure 61 is in the closed configuration the edges of the upper portion abut each other so that there is no gap between the upper edges. This may help to prevent the radius of curvature of the bendable portion 5 exceeding a threshold.

Figure 6C:
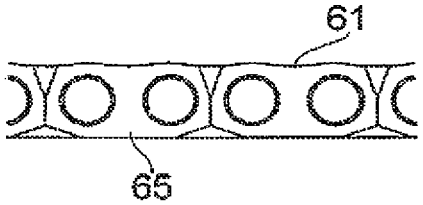

FIG. 6C illustrates a side view of the support structure 61 in an open configuration. As the outer linking portions 65 are shaped so that they are wider at the upper portion than at the lower portion when the support structure 61 is in the closed configuration the edges of the lower portion abut each other. When the support structure 61 is in the closed configuration there is no gap between the lower edges. This may help to prevent the bendable portion 5 from bending in the wrong direction.

Figure 6D:
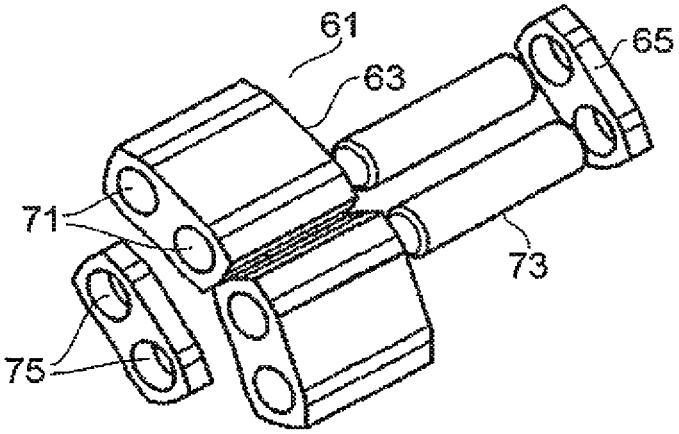

FIG. 6D illustrates an exploded view of portions 63, 65 of the support structure 61. The inner linking portions 63 may be shaped so as to control the way the support structure 61 bends when a force is applied by a user. In the example of FIG. 6D the inner linking portions 63 are shaped so that if a first part of the support structure 61 is bent more than a second part the inner linking portions 63 in the first part will contact adjacent inner linking portions 63 and cause them to rotate. This may cause the support structure 61 to bend evenly. This may provide for bending forces and the associated stresses and strains to be evenly distributed throughout the support structure. When the support structure 61 is in the open and/or closed configurations the outer linking portions 65 may contact each other to prevent further bending of the support structure as illustrated in FIGS. 6B and 6C and described above.

The inner linking portions 63 comprise two holes 71. The holes 71 may extend right through the linking portion 63.

A pin 73 is provided in each of the holes 71. The pin 73 may extend right through the inner linking portion 65. The pins 73 may be made of any suitable material such as metal. The pins 73 may have a polished metal surface.

In the example of FIGS. 6A to 6D the holes 71 and pins 73 have a circular cross section. This allows for rotation of the pin 73 within the hole 71.

The outer linking portion 65 also comprises two holes 75. The holes 75 on the outer linking portion 65 may be configured to receive a portion of the pin 73 which extends out of the inner linking portion 63. This may enable the inner linking portion 63 and the outer linking portion 65 to be coupled together.

The outer linking portion 65 is configured to receive a portion of a pin 73 which extends out of a first inner linking portion 63 in one hole 75 and a to receive a portion of a pin 73 which extends out of a second inner linking portion 63 in a second hole 75. The pins 73 may be fixed to the outer linking portions 65 by any suitable means. In some examples the pins 73 may be fixed to the outer linking portions so as to prevent the pins 73 rotating relative to the outer linking portions 65. For example the pins 75 may be welded to the outer linking portions 65. This enables the respective linking portions 63, 65 to be coupled together to create a plurality of interlinked portions.

The pins 73 may be configured to fit tightly in the holes 71 so that the frictional force of the surface of the pin 73 against the walls of the hole 71 prevents movement of the linking portions 63, 65 relative to each other. This force acts to restrict movement of the substrate 3. However the frictional force may be overcome by a user applying an appropriate force to the respective portions of the substrate 3. Therefore the support structure 61 may provide a mechanism which enables the substrate 3 to be held in positions such as partially open positions.

Figure 7A:
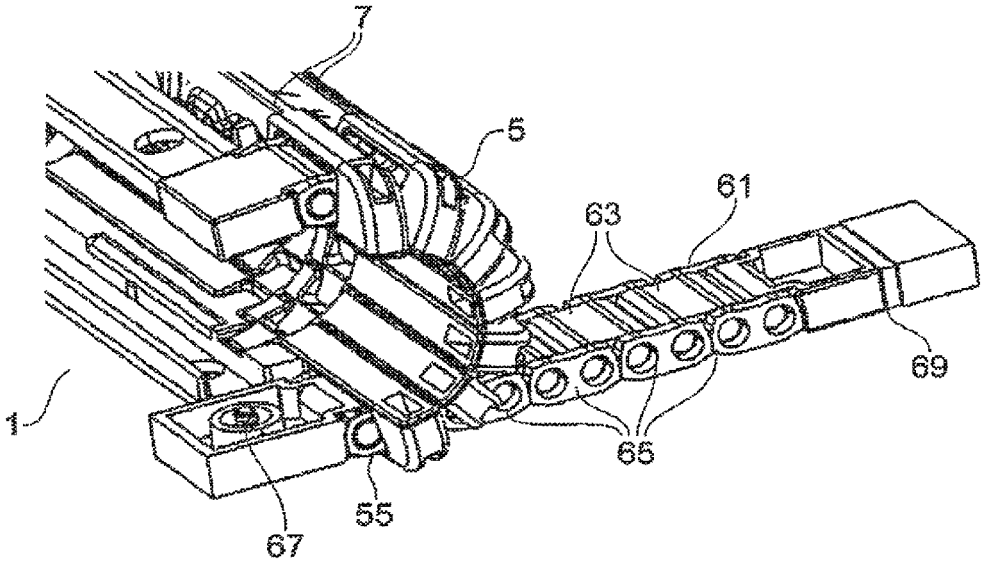
FIGS. 7A and 7B illustrate an apparatus.
Figure 7B:
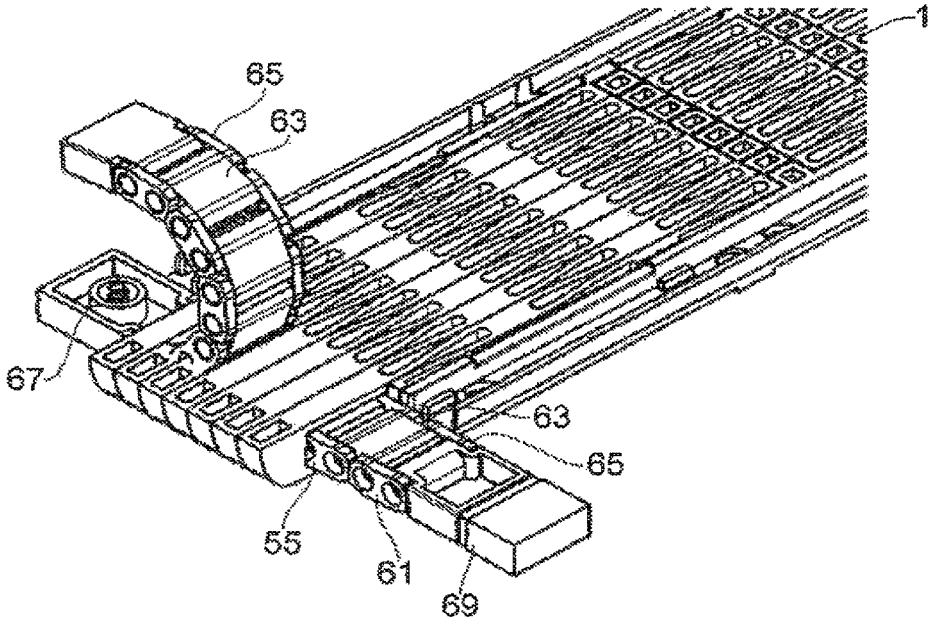

FIGS. 7A and 7B illustrate an apparatus comprising a bendable portion 5 and a support structure 61 as illustrated in FIGS. 6A to 6D.

In the example of FIG. 7A the bendable portion 5 comprises a plurality of rod members 7 and the support structure 61 extends through a plurality of holes 55 provided in the rod members 7.

In the example of FIG. 7B the bendable portion comprises a mesh structure and the support structure 61 is provided in a plurality of holes 55 adjacent to the mesh structure.

Figure 8A:
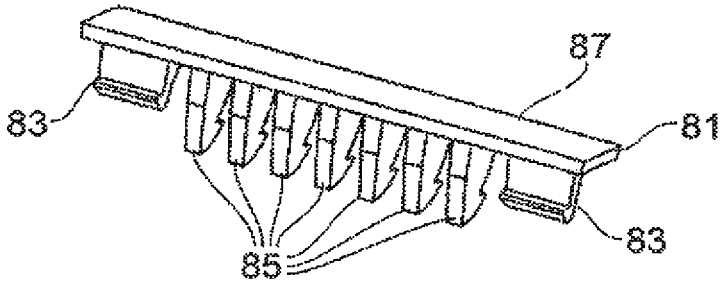
FIGS. 8A to 8C illustrate an additional support substrate.
Figure 8B:
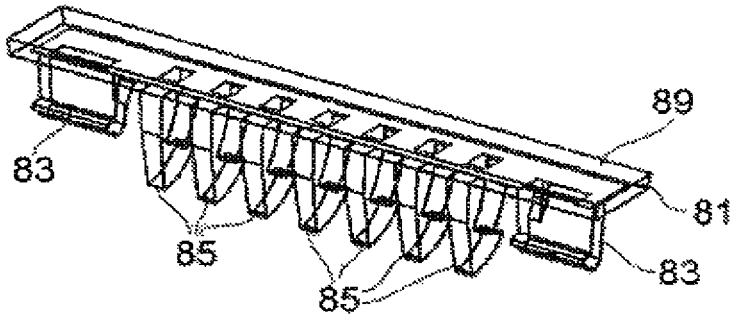
Figure 8C:
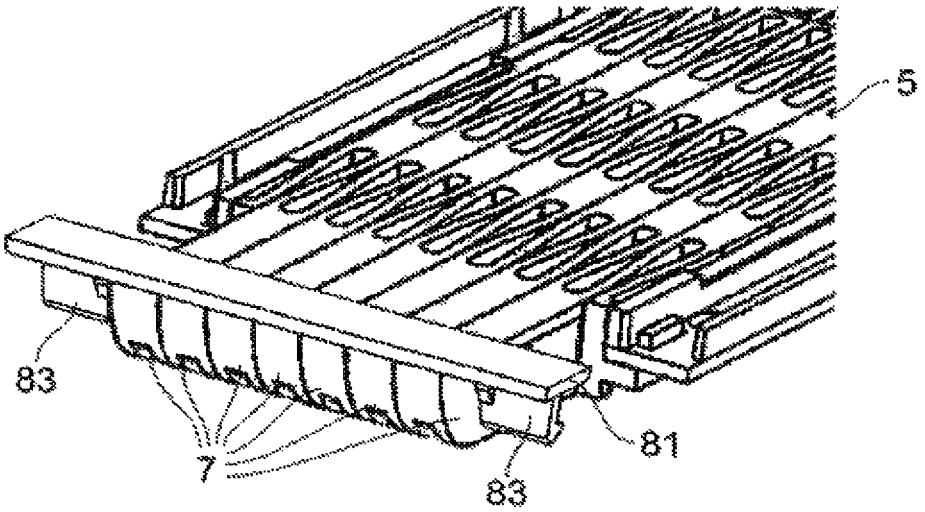

FIGS. 8A to 8C illustrate an additional support substrate 81. The additional support substrate 81 may be configured to be provided at the side of the apparatus 1. The additional support substrate 81 may be provided to improve the strength of the substrate 3 and to improve the cycle durability. The additional support substrate 81 may prevent lengthening of the bendable portion 5 as the apparatus 1 is moved between the open and the closed configurations. The additional support substrate 81 may be configured to protect a display and other components from a peeling force when the apparatus is moved from the closed configuration to an open configuration. The peeling force may cause the display and other components to pull away from the substrate 3.

In the examples of FIGS. 8A to 8C the additional support substrate 81 comprises an upper support surface 87. The upper support surface 87 may comprise a flat or substantially flat surface. The upper support surface may be made of plastic or any other suitable material.

The additional support substrate 81 also comprises a plurality of first locking portions 83 and a plurality of second locking portions 85. The locking portions 83, 85 may be configured to couple the additional support substrate 81 to the substrate 3. The plurality of locking portions 83, 85 extend down from the underside of the upper support surface 87.

The first locking portions 83 comprise members which may be configured to fit into corresponding recesses on respective regions 9, 11 of the substrate 9. The second locking portions 85 comprise members which are configured to fit into corresponding second holes 57 in the edge portion 51 of the rod member 7.

FIG. 8B illustrates the additional support substrate 81 with a metal sheet 89 provided on the upper support surface 87. The metal sheet 89 may be flexible to enable the apparatus 1 to move between an open and closed configuration. The metal sheet 89 may be provide support for electronic components such as a flexible display.

FIG. 8C illustrates the additional support substrate 81 positioned on an apparatus 1. The second locking portions 83 are provided within second holes 55 in the edge portions 51 of the rod members 7. This secures the additional support substrate 81 in position in the apparatus 1. This may enable the additional support substrate 81 to be coupled to the rod members 7.

Figure 9:
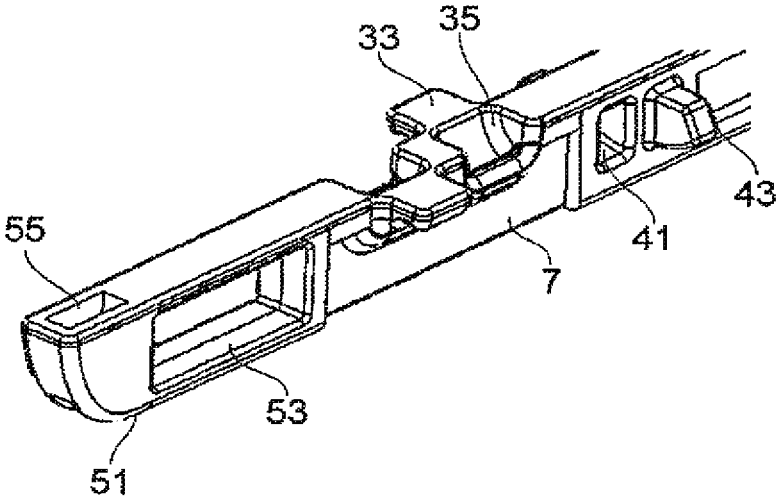
FIG. 9 illustrates a portion of a rod member.

FIG. 9 illustrates a portion of a rod member 7 in more details. The rod member comprises an edge portion 51 as described above. The edge portion 51 comprises a first hole 53 for receiving a support structure 61 and a second hole 55 for receiving a second locking portion 83 of an additional support substrate 81.

Figure 10:
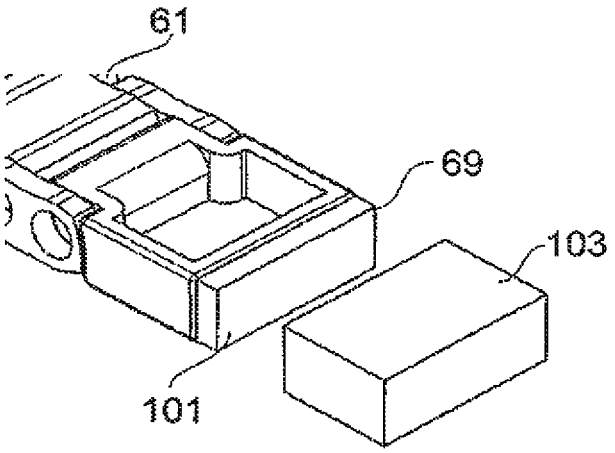
FIG. 10 illustrates an example locking mechanism.

FIG. 10 illustrates an example locking mechanism 69 in more detail. The locking mechanism 69 may be provided on an end of the support structure 61.

The locking mechanism 69 may be configured to lock the apparatus 1 in the open configuration. In some examples the locking mechanism 69 may comprise mechanisms configured to hold the apparatus 1 in a partially open configuration.

In the example of FIG. 10 the locking mechanism comprises a first magnet 101 and a second magnet 103. The first magnet 101 may be coupled to the support chain 101 so that the first magnet 101 moves with the support chain. The second magnet may be coupled to a region 9, 11 of the substrate 3 so that when the region 9, 11 moves the second magnet 103 also moves. The magnets 101, 103 may be configured to provide an attractive force between each other so as to hold the two portions of the substrates 9, 11 in position relative to each other. In some examples one of the magnets 101, 103 may be replaced with a piece of metal such as iron.

Figure 11:
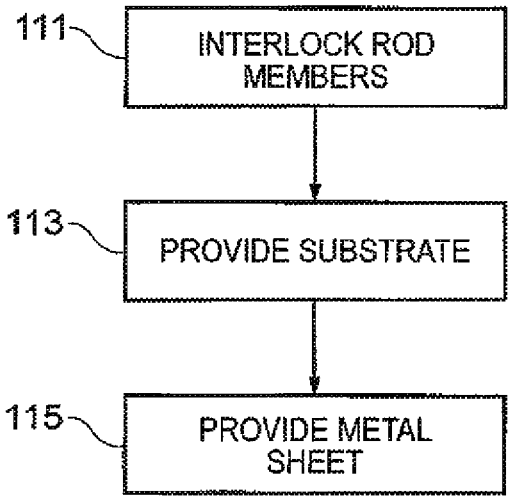
FIG. 11 illustrates a method.

FIG. 11 illustrates a method of providing an apparatus as described above according to an example of the disclosure. The method comprises interlocking a plurality of rod members 7. The plurality of rod members may be as described above.

At block 113 a bendable substrate 3 is provided. The bendable substrate 3 comprises a bendable portion 5. The bendable portion may be formed from the plurality of interlocked rod members 7. The substrate may also comprise regions 9, 11 on either side of the bendable portion 5.

At block 115 a flexible sheet 21 is provided. The flexible sheet 21 may be provided overlaying the substrate 3. The flexible sheet 21 may be adhered or bonded to the substrate 3. The flexible sheet 21 may enable components to be mounted to the substrate 3. In some examples the flexible sheet 21 may couple the plurality of rod members 7 together.

The flexible sheet 21 may be flexible to allow the substrate 3 to be moved between an open and closed configuration.

Examples of the apparatus 1 and method described above provide for a bendable apparatus 1 which has a bendable portion 5 which is arranged to allow the apparatus 1 to be easily moved between the open and the closed configurations but prevent further deformation of the apparatus 1. This may protect components such as a flexible display 5 and other sensitive electronic components mounted on the substrate 3 from damage.

The structure of the bendable portion is simple yet it provides a strong and rigid structure both in the closed and open configuration. The user can easily move the apparatus 1 between the two configurations.

As the rigid locking structure is integral to the rod members in the bendable portion this allows the support to be provided without making the resulting apparatus 1 too bulky.

The term "comprise" is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this detailed description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some or all other examples. Thus "example", "for example" or "may" refer to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed. For example in the above description it is explained how the support structure provides a rigid support for the bendable portion 5 of the substrate 3 when the display 5 is in the closed configuration. It is to be appreciated that the support structure may also provide a support for the bendable portion 5 of the substrate 3 when the display 5 is not in the closed configuration. For example, the support structure may provide a support for the bendable portion 5 of the substrate 3 when the display 5 is in an open or partially open configuration.

Also in some examples the apparatus 1 may comprise sensors, such as optical sensors, which may be configured to detect the position and/or movement of the support structure 41. This may enable the angle between the regions 9, 11 of the substrate to be determined.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:

a substrate configured to support a bendable display, the substrate comprises at least one bendable portion configured to enable the substrate to be moved between an open configuration and a closed configuration;

and an additional support substrate configured to provide further support for at least a portion of the bendable display;

wherein the additional support substrate is provided at a side of the apparatus;

wherein the at least one bendable portion comprises a plurality of rod members and the rod members comprise interlocking portions;

wherein the interlocking portions comprise a projection configured to fit into a corresponding recess on an adjacent rod member so as to restrict relative movement of the rod members when the substrate is in the closed configuration;

wherein the substrate is configured to restrict movement of the rod members when the substrate is in the open configuration;

wherein the additional support substrate is coupled to the rod members and wherein the additional support substrate comprises a plurality of projections for interlocking with a plurality of recesses on the plurality of rod members.

2. An apparatus as claimed in claim 1 wherein the interlocking portions are configured to prevent a radius of curvature of the bendable portion exceeding a threshold.

3. An apparatus as claimed in claim 1 wherein the rod members extend horizontally across the apparatus.

4. An apparatus as claimed in claim 1 wherein the rod members are coupled together by a flexible layer.

5. An apparatus as claimed in claim 4 wherein the flexible layer comprises metal.

6. An apparatus as claimed in claim 1 further comprising a support structure configured to restrict movement of the substrate, and wherein the support structure comprises at least one frictional component wherein the frictional component is configured to oppose movement of the substrate.

7. An apparatus as claimed in claim 6 wherein the support structure is coupled to the substrate.

8. An apparatus as claimed in claim 6 wherein the support structure is configured to pass through holes in the rod members.

9. An apparatus as claimed in claim 1 further comprising the bendable display coupled to the bendable portion.

10. An apparatus as claimed in claim 9 wherein the apparatus is in the closed configuration, a first portion of the bendable display and a second portion of the bendable display are configured facing each other.

11. An apparatus as claimed in claim 1 further comprising a magnet for holding the apparatus in an open configuration.

12. A device comprising:

a display;

a substrate configured to enable at least a portion of the display to be bendable, the substrate comprises at least one bendable portion configured to enable the substrate to be moved between an open configuration and a closed configuration;

an additional support substrate configured to provide further support for at least a portion of the display;

wherein the additional support substrate is provided at a side of the device;

wherein the at least one bendable portion comprises a plurality of rod members and the rod members comprise interlocking portions;

wherein the interlocking portions comprise a projection from one rod member configured to fit into a corresponding recess on an adjacent rod member so as to restrict relative movement of the rod members when the substrate is in the closed configuration;

wherein the substrate is configured to restrict movement of the rod members when the substrate is in the open configuration;

wherein the additional support substrate is coupled to the rod members and wherein the additional support substrate comprises a plurality of projections for interlocking with a plurality of recesses on the plurality of rod members.

13. A device as claimed in claim 12 wherein the display is coupled to the substrate via a flexible sheet.

14. A device as claimed in claim 13 wherein the flexible sheet is adhered to the substrate.

15. A device as claimed in claim 12 wherein the display comprises at least another portion that is substantially straight or not bendable.

16. A devise device as claimed in claim 15 wherein the display is continuous across the at least the bendable portion and the at least another portion that is substantially straight or not bendable.

17. A device as claimed in claim 12 wherein the substrate is in the open configuration indicates that a radius of curvature of the bendable portion exceeds a first threshold, the substrate is in the closed configuration indicates that the radius of curvature of the bendable portion is below a second threshold, and the first threshold and the second threshold may or may not be the same.

18. A method comprising:

providing a substrate configured to support a bendable display, the substrate comprises at least one bendable portion configured to enable the substrate to be moved between an open configuration and a closed configuration;

providing an additional support substrate configured to provide further support for at least a portion of the bendable display;

wherein the additional support substrate is provided at a side of an apparatus;

providing a plurality of rod members within the at least one bendable portion;

wherein the rod members comprise interlocking portions;

wherein the interlocking portions comprise a projection configured to fit into a corresponding recess on an adjacent rod member so as to restrict relative movement of the rod members when the substrate is in the closed configuration;

wherein the substrate is configured to restrict movement of the rod members when the substrate is in the open configuration;

wherein the additional support substrate is coupled to the rod members and wherein the additional support substrate comprises a plurality of projections for interlocking with a plurality of recesses on the plurality of rod members.

*19. An apparatus comprising:*

*a substrate comprising a first portion and a second portion, at least one of the first portion and the second portion configured to support respective substantially rigid portions of a display; and*

*at least one bendable portion coupling the first portion and the second portion and configured to enable the substrate to be moved between an open configuration and a closed configuration;*

*wherein the at least one bendable portion comprises a plurality of adjacently-positioned elongated rod members, each of the rod members having interlocking portions, the interlocking portions comprising at least one projection integrally formed with and extending from the rod members and at least one recess formed in the rod members;*

*wherein adjacently-positioned rod members, when the substrate is in the open configuration, abut against each other to prevent the at least one bendable portion from being bent into a reflex angle;*

*wherein the projections are configured to fit into a corresponding recess on an adjacent rod member so as to restrict relative movement of the rod members when the substrate is in the closed configuration; and*

*wherein the first and second portions of the substrate are configured to restrict movement of the rod members when the substrate is in the open configuration.*

*20. The apparatus of claim 19, further comprising an additional support substrate configured to provide further support for at least a portion of the display on at least one of the first portion and the second portion, wherein the additional support substrate is provided at a side of the apparatus, wherein the additional support substrate is coupled to the rod members, and wherein the additional support substrate comprises a plurality of projections for interlocking with a plurality of recesses on the plurality of rod members.*

*21. The apparatus of claim 19, wherein the interlocking portions are configured to prevent a radius of curvature of the bendable portion exceeding a threshold.*

*22. The apparatus of claim 19, wherein the rod members extend horizontally across the apparatus.*

*23. The apparatus of claim 19, wherein the rod members are positioned adjacent to each other to provide a flat or substantially flat surface for the at least one bendable portion.*

*24. The apparatus of claim 19, wherein the rod members are coupled together by a flexible layer.*

*25. The apparatus of claim 19, further comprising a support structure configured to restrict movement of the first portion relative to the second portion, and wherein the support structure comprises at least one frictional component wherein the frictional component is configured to oppose movement of the first portion relative to the second portion.*

*26. The apparatus of claim 25, wherein the support structure is coupled to at least one of the first portion and the second portion.*

*27. The apparatus of claim 25, wherein the support structure is configured to pass through holes in the rod members.*

*28. The apparatus of claim 19, wherein when the apparatus is in the closed configuration, the first portion and the second portion are configured facing each other.*

*29. The apparatus of claim 19, further comprising a magnet for holding the apparatus in an open configuration.*

*30. A device comprising:*

*a first substrate,*

*a second substrate;*

*at least one bendable portion coupling the first substrate and the second substrate, the at least one bendable portion configured to enable the first substrate and the second substrate to be moved between an open configuration in which the first substrate and the second substrate are coplanar or substantially coplanar and a closed configuration in which the first substrate and the second substrate are interfacially positioned or substantially interfacially positioned; and*

*respective portions of a substantially rigid display located on the first substrate and the second substrate;*

*wherein the at least one bendable portion comprises a plurality of rod members and the rod members comprise interlocking portions, and wherein the interlocking portions each comprise a projection individually formed with and extending from one rod member and configured to fit into a corresponding recess on an adjacent rod member so as to restrict relative movement of the rod members when the first substrate and the second substrate are in the closed configuration, wherein adjacently-positioned rod members, when the first substrate and the second substrate are in the open configuration, abut against each other to prevent the at least one bendable portion from being bent into a reflex angle.*

*31. The device of claim 30, wherein the rod members are positioned adjacent to each other to provide a flat or substantially flat surface for the at least one bendable portion.*

*32. The device of claim 30, further comprising an additional support substrate configured to provide further support for at least a portion of the display, wherein the additional support substrate is provided at a side of the device, wherein the additional support substrate is coupled to the rod members, and wherein the additional support substrate comprises a plurality of projections for interlocking with a plurality of recesses on the plurality of rod members.*

*33. The device of claim 30, wherein the first substrate and the second substrate in the open configuration indicates that a radius of curvature of the bendable portion exceeds a first threshold, and the first substrate and the second substrate in the closed configuration indicates that the radius of curvature of the bendable portion is below a second threshold, and the first threshold and the second threshold may or may not be the same.*

*34. A method comprising:*

*providing a substrate comprising a first portion and a second portion, at least one of the first portion and the second portion configured to support a respective portion of a substantially rigid display, and at least one bendable portion coupling the first portion and the second portion and configured to enable the substrate to be moved between an open configuration and a closed configuration;*

*wherein the at least one bendable portion comprises a plurality of adjacently-positioned elongated rod members, each of the rod members having interlocking portions, the interlocking portions comprising at least one projection integrally formed with and extending from the rod members and at least one recess formed in the rod members;*

*wherein adjacently-positioned rod members, when the substrate is in the open configuration, abut against each other to prevent the at least one bendable portion from being bent into a reflex angle;*

*wherein the projections are configured to fit into a corresponding recess on an adjacent rod member so as to restrict relative movement of the rod members when the substrate is in the closed configuration; and*

*wherein the substrate is configured to restrict movement of the rod members when the substrate is in the open configuration.*

*35. The method of claim 34, further comprising providing an additional support substrate configured to provide further support for at least a portion of the display on at least one of the first portion and the second portion, wherein the additional support substrate is provided at a side of the apparatus, and wherein the additional support substrate is coupled to the rod members and wherein the additional support substrate comprises a plurality of projections for interlocking with a plurality of recesses on the plurality of rod members.*

*36. The apparatus of claim 19, wherein the at least one bendable portion is provided at a midpoint of the substrate.*

* * * * *